(12) United States Patent
Park

(10) Patent No.: US 9,330,742 B2
(45) Date of Patent: May 3, 2016

(54) SEMICONDUCTOR DEVICE AND SYSTEM INCLUDING THE SAME

(71) Applicant: SK hynix Inc., Gyeonggi-do (KR)

(72) Inventor: Jung-Hoon Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 225 days.

(21) Appl. No.: 14/106,826

(22) Filed: Dec. 15, 2013

(65) Prior Publication Data

US 2015/0046743 A1 Feb. 12, 2015

(30) Foreign Application Priority Data

Aug. 9, 2013 (KR) ........................ 10-2013-0094747

(51) Int. Cl.
| | |
|---|---|
| G06F 1/04 | (2006.01) |
| G11C 8/18 | (2006.01) |
| G11C 29/02 | (2006.01) |
| G11C 29/18 | (2006.01) |
| G11C 8/06 | (2006.01) |

(52) U.S. Cl.
CPC ................ *G11C 8/18* (2013.01); *G11C 29/028* (2013.01); *G11C 29/18* (2013.01); *G11C 8/06* (2013.01)

(58) Field of Classification Search
None
See application file for complete search history.

(56) References Cited

U.S. PATENT DOCUMENTS

| | | | | |
|---|---|---|---|---|
| 6,061,304 A | * | 5/2000 | Nagata | G04G 19/12 368/204 |
| 7,346,794 B1 | * | 3/2008 | Davidson | G06F 1/10 713/400 |
| 7,836,259 B1 | * | 11/2010 | Filippo | G06F 12/0862 711/137 |
| 2008/0136476 A1 | * | 6/2008 | Ku | H03L 7/0814 327/158 |
| 2009/0119419 A1 | * | 5/2009 | Bae | G06F 13/4243 710/4 |

FOREIGN PATENT DOCUMENTS

KR 1020070121465 12/2007

* cited by examiner

*Primary Examiner* — Kim Huynh
*Assistant Examiner* — Paul J Yen
(74) *Attorney, Agent, or Firm* — IP & T Group LLP

(57) ABSTRACT

A semiconductor device includes a plurality of data output circuits suitable for outputting data; an address training driver suitable for generating a plurality of address training data and a control signal; a plurality of data lines suitable for transferring the address training data to the data output circuits; and a self-correction circuit suitable for correcting a delay time of the address training data that reaches the data output circuits from the address training driver through the plurality of data lines, and correcting skew of the data that is outputted from the data output circuits.

16 Claims, 8 Drawing Sheets

SEMICONDUCTOR DEVICE AND SYSTEM INCLUDING THE SAME

CROSS-REFERENCE TO RELATED APPLICATIONS

The present application claims priority of Korean Patent Application No. 10-2013-0094747, filed on Aug. 9, 2013, which is incorporated herein by reference in its entirety.

BACKGROUND

1. Field

Exemplary embodiments of the present invention relate to a semiconductor design technology, and more particularly, to a semiconductor device for performing an address training operation, and a system including the same.

2. Description of the Related Art

In a high speed semiconductor device, an address is inputted at a speed twice as fast as that of a clock. Accordingly, a new operation called an address training operation has been introduced. According to this operation, a chipset sends a first address to a semiconductor device, the semiconductor device outputs a second address based on the first address to the chipset again, and the chipset checks whether the first address coincides with the second address, thereby finding an area where the address is normally recognized.

In the address training operation, data for training an address, which are generated in an address training driver, are first outputted at an output pin near the address training driver as compared with an output pin remote from the address training driver. Therefore, skew occurs between the pins. Furthermore, in the address training operation between the chipset and the semiconductor device, since it is necessary to change an output timing of data according to output pins, a time required for the address training operation may increase, resulting in the deterioration of performance.

SUMMARY

An exemplary embodiment of the present invention is directed to a semiconductor device capable of minimizing skew between output data during an address training operation.

In accordance with an exemplary embodiment of the present invention, a semiconductor device may include a plurality of data output circuits suitable for outputting data; an address training driver suitable for generating a plurality of address training data and a control signal; a plurality of data lines suitable for transferring the address training data to the data output circuits; and a self-correction circuit suitable for correcting a delay time of the address training data that reaches the data output circuits from the address training driver through the plurality of data lines, and correcting skew of the data that is outputted from the data output circuits.

In accordance with an exemplary embodiment of the present invention, a semiconductor device may include a semiconductor device suitable for providing a controller with a plurality of address training data through a plurality of pins in response to an address and a command transmitted from the controller; and the controller suitable for checking whether the transmitted address coincides with the received address training data, wherein the semiconductor device comprises: an address training driver suitable for generating the plurality of address training data and a control signal in response to the address and the command; and a self-correction circuit suitable for correcting a delay time of the address training data that reaches the plurality of pins from the address training driver, and correcting skew of the address training data that is outputted from the pins.

In accordance with an exemplary embodiment of the present invention, a semiconductor device may include a plurality of data output circuits suitable for outputting data; an address training driver suitable for generating a plurality of address training data and a control signal, and outputting the address training data to the data output circuits through a plurality of data lines; a first signal line including a plurality of output nodes, each outputting a delay value proportional to a delay of each node of the plurality of data lines, suitable for receiving the control signal; a second signal line including a plurality of output nodes, each outputting a delay value inversely proportional to the delay of each node of the plurality of data lines, suitable for receiving a feedback control signal at a final output node of the first signal line; and a delay block suitable for correcting a delay time of the address training data that reaches the data output circuits from the address training driver in response to the delay values at the output nodes of the first signal line and the second signal line.

According to the exemplary embodiment of the present invention, it may be possible to simultaneously output data for training an address to an external pin during an address training operation.

DETAILED DESCRIPTION

Figure 1:
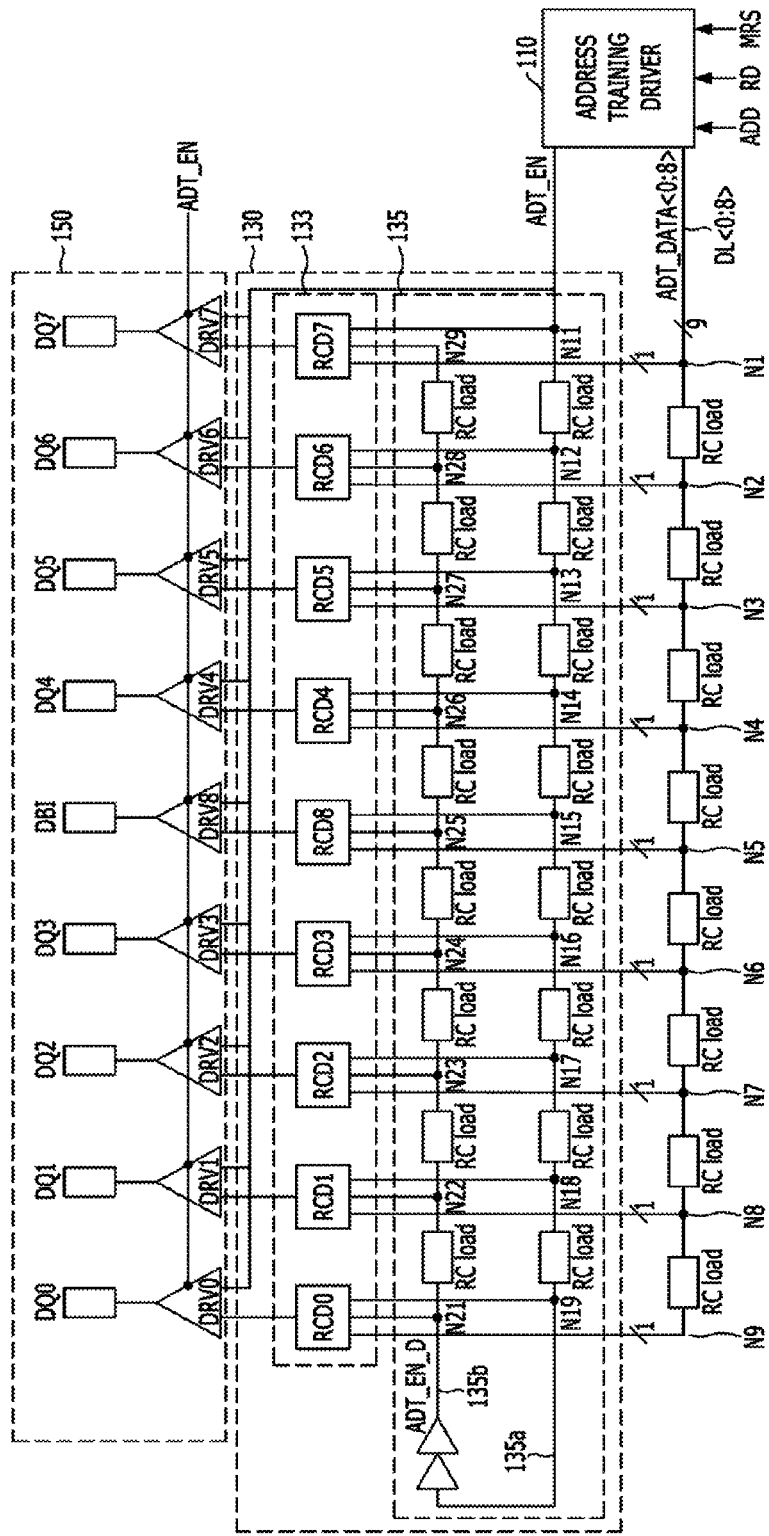
FIG. 1 is a block diagram of a semiconductor device in accordance with an exemplary embodiment of the present invention.

Various exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

FIG. 1 is a block diagram of a semiconductor device in accordance with an exemplary embodiment of the present invention.

Referring to FIG. 1, the semiconductor device may include an address training driver 110, a plurality of data lines DL<0:8>, a self-correction circuit 130, and a data output circuit 150.

The address training driver 110 may generate a control signal ADT_EN and data for training an address (hereinafter, referring t to as an 'address training data ADT_DATA<0:8>')

in response to an address ADD, an external command MRS and a read command RD. The control signal ADT_EN may be outputted to the self-correction circuit 130 and the data output circuit 150, and the address training data ADT_DATA<0:8> may be loaded onto the plurality of data lines DL<0:8>.

The data output circuit 150 may include output drivers DRV0 to DRV8 that are enabled by the control signal ADT_EN to drive an output of the self-correction circuit 130, and output pads DQ0 to DQ7 and a Data Bus Inversion (DBI) that transfers signals from the output drivers DRV0 to DRV8.

In a read operation mode and a write operation mode, data in the DBI denotes whether data in the output pads DQ0 to DQ7 are inverted or not. In an address training mode, the DBI is an ordinary output pad like the output pads DQ0 to DQ7 for transferring signals from the output drivers DRV0 to DRV8.

The self-correction circuit 130 may correct a delay time of the address training data ADT_DATA<0:8> reaching the data output circuit 150 from the address training driver 110 through the plurality of data lines DL<0:8>, and correct skew between data that are outputted from the data output circuit 150.

The self-correction circuit 130 may include an RC delay detection block 135 and a delay block 133.

The RC delay detection block 135 may obtain RC delay information on data line nodes N1 to N9 of the plurality of data lines DL<0:8> corresponding to the data output circuit 150. In detail, the RC delay detection block 135 may include a first signal line 135a and a second signal line 135b. The first signal line 135a may include a plurality of first nodes N11 to N19 that output delay values proportional to RC delay of the data line nodes N1 to N9 of the plurality of data lines DL<0:8>, and the control signal ADT_EN may be loaded onto the first signal line 135a. The second signal line 135b may include a plurality of second nodes N21 to N29 that output delay values inversely proportional to the RC delay of the data line nodes N1 to N9 of the plurality of data lines DL<0:8>, and a feedback control signal ADT_EN_D may be loaded onto the second signal line 135b. Here, the feedback control signal ADT_EN_D is a signal at the first node N19, which is the last node of the first signal line 135a.

The delay block 133 of the self-correction circuit 130 may include a plurality of delay lines RCD0 to RCD8. The delay block 133 may correct a delay time at which the address training data ADT_DATA<0:8> reach the respective output drivers DRV0 to DRV8 in response to an output of the RC delay detection block 135.

Figure 2:
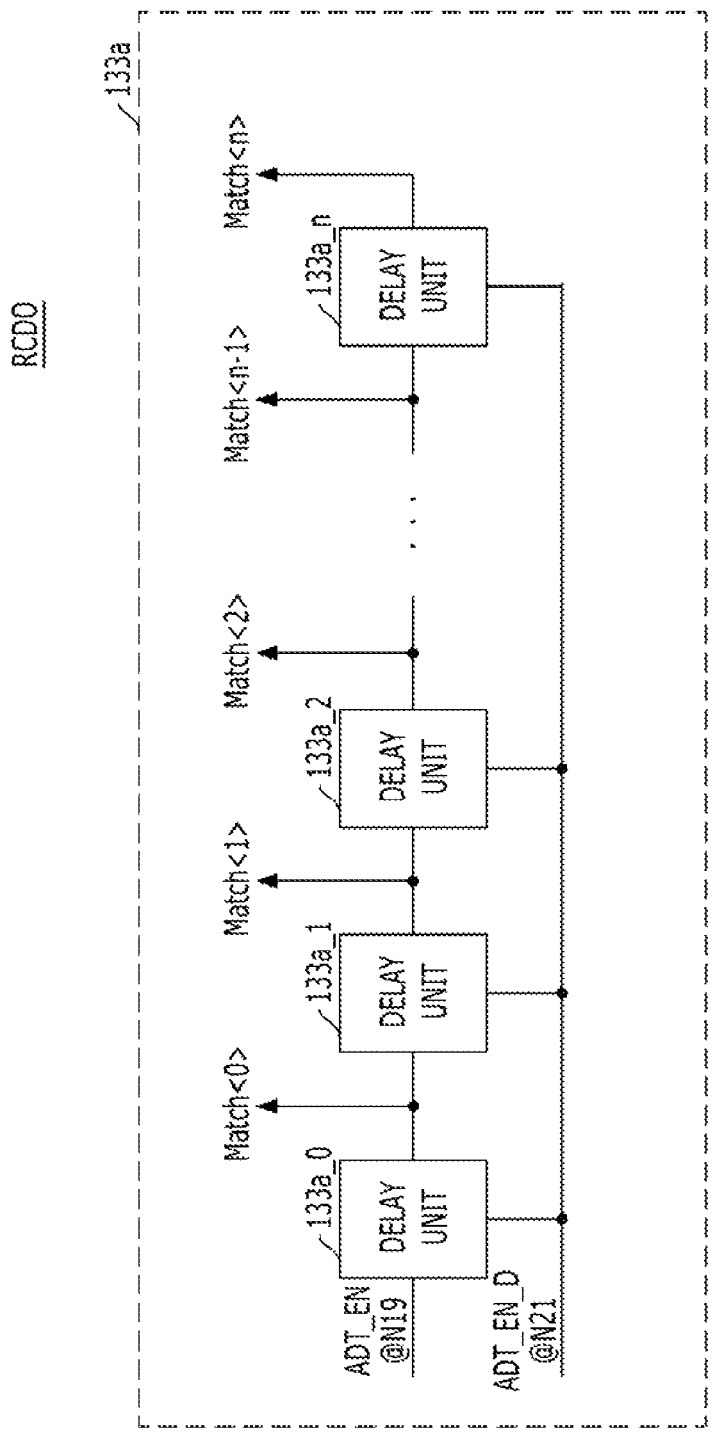
FIGS. 2 and 3 are detailed block diagrams of a delay line of FIG. 1.
Figure 3:
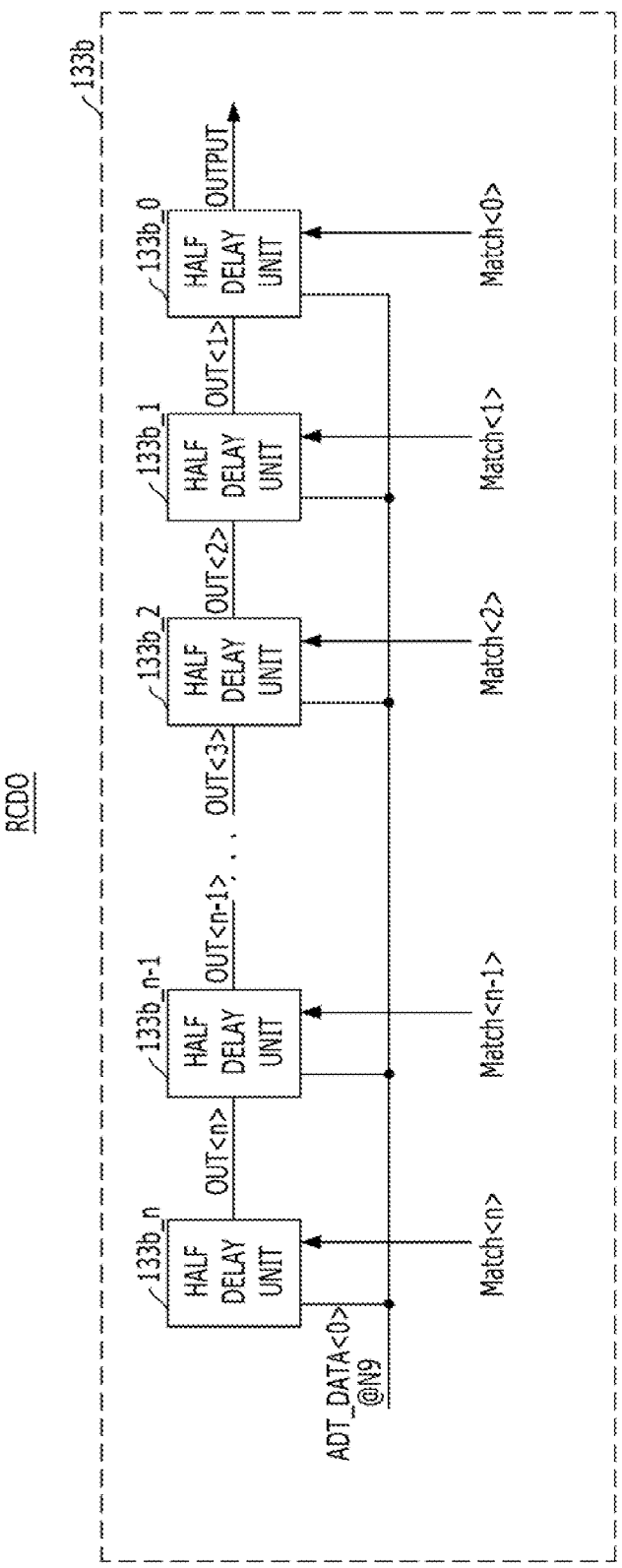

FIGS. 2 and 3 are detailed block diagrams of a first delay line RCD0 of FIG. 1. Since the delay lines RCD1 to RCD 7 have substantially the same structures as that of the first delay line RCD0, the first delay line RCD0 is explained in FIGS. 2 and 3 as an example.

Referring to FIGS. 2 and 3, the first delay line RCD0 may include a matching unit 133a and a correction unit 133b.

The matching unit 133a may output matching signals Match<0:n> by checking the RC delay of the data line nodes N1 to N9 of the data lines DL<0:8> in response to the control signal ADT_EN at the first node N19 of the first signal line 135a, and the feedback control signal ADT_EN_D at the second node N21 of the second signal line 135b.

The correction unit 133b may correct output timings of the address training data ADT_DATA<0:8> transferred from the data line nodes N1 to N9 of the data lines DL<0:8> in response to the matching signals Match<0:n>.

Hereinafter, the matching unit 133a and the correction unit 133b will be described in detail. The matching unit 133a may include a plurality of first delay units 133a_0 to 133a_n serially coupled to one another. The first delay units 133a_0 to 133a_n may receive the control signal ADT_EN at the first node N19 of the first signal line 135a or an output of a previous delay unit as a first input signal, and delay the first input signal. Further, the first delay units 133a_0 to 133a_n may receive the feedback control signal ADT_EN_D at the second node N21 of the second signal line 135b as a second input signal, and activate the matching signals Match<0:n> by comparing the first input signal with the second input signal.

The correction unit 133b may include a plurality of second delay units 133b_0 to 133b_n that receive the matching signals Match<0:n> and the address training data ADT_DATA<0> at the data line node N9 of the plurality of data lines DL<0:8>. The second delay units 133b_0 to 133b_n may output a final output signal OUTPUT whose output timing has been corrected by delaying the address training data ADT_DATA<0> in response to the matching signals Match<0:n>.

Figure 4:
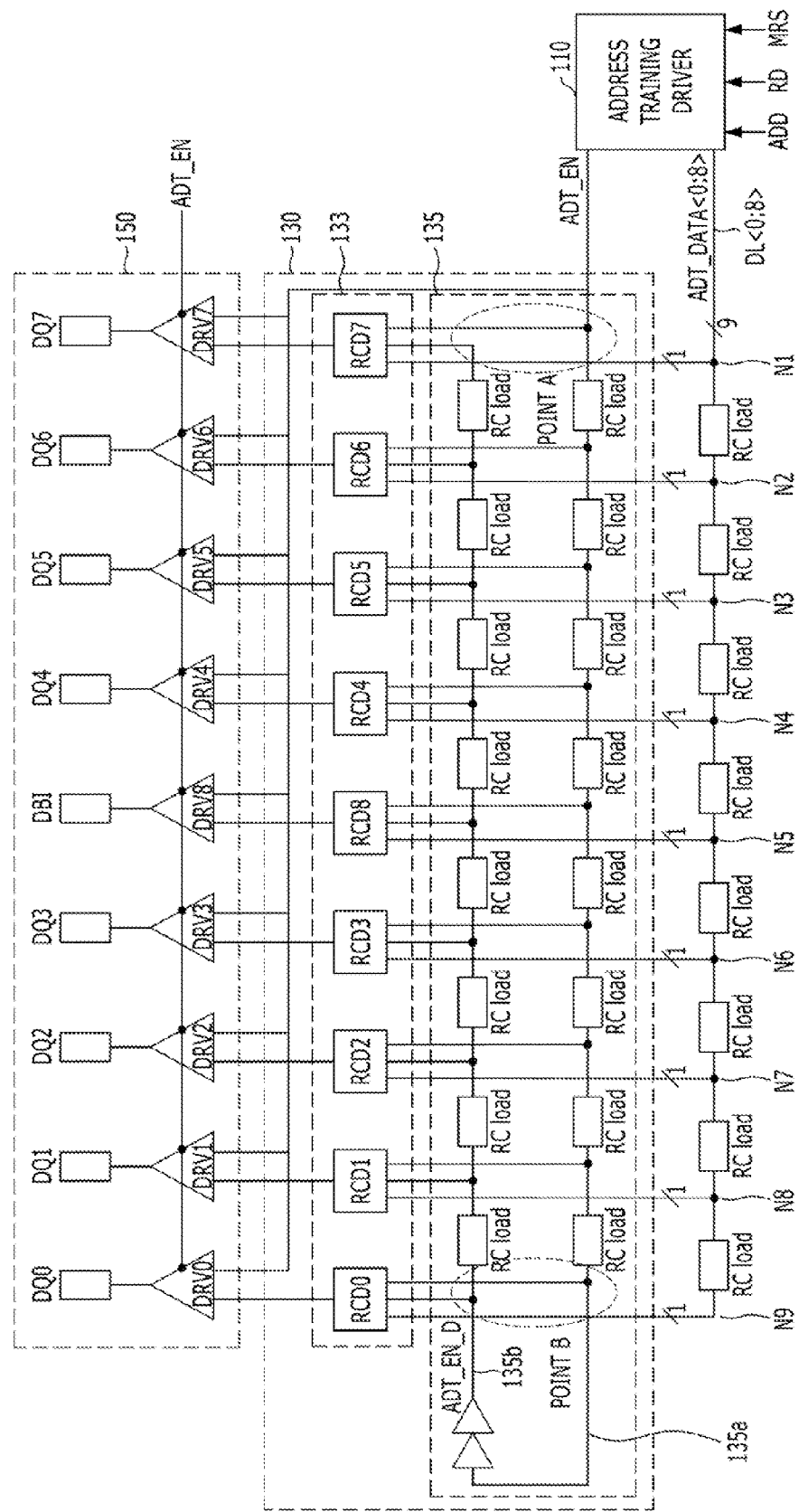
FIGS. 4 to 7 are block and timing diagrams explaining an operation of a semiconductor device in accordance with an exemplary embodiment of the present invention.

FIG. 4 is a block diagram explaining an operation of the semiconductor device in accordance with an exemplary embodiment of the present invention.

Referring to FIG. 4, the operation of the semiconductor device in accordance with the exemplary embodiment of the present invention will be described. In FIGS. 1 and 4, like reference numerals are used to refer to the same elements.

The address training driver 110 generates the control signal ADT_EN in response to the address ADD and the external command MRS. Then, when the read command RD and the address ADD are simultaneously inputted, the address training driver 110 generates the address training data ADT_DATA<0:8>. The address training data ADT_DATA<0:8> may be mapped to the respective output pads DQ0 to DQ7 and DBI one to one.

The address training data ADT_DATA<0:8> may be transferred to the output pads DQ0 to DQ7 and DBI in a such way that the ninth address training data ADT_DATA<8> may be transferred to the eighth output pad DQ7 nearest the address training driver 110. At this time, the other address training data ADT_DATA<0:7> are sequentially transferred to the respective output pads DQ0 to DQ6 and DBI, e.g., the first address training data ADT_DATA<0> is transferred to the remotest output pad DQ0. In this case, an RC delay time between the ninth address training data ADT_DATA<8> and the first address training data ADT_DATA<0> may occur due to a difference of lengths between the data lines DL<0:8>.

As described above, a time required for transferring the address training data ADT_DATA<0:8> to the output pads DQ0 to DQ7 and DBI are changed according to the RC delay time. Accordingly, when the data is directly transferred to the output drivers DRV0 to DRV8 corresponding to the output pads DQ0 to DQ7 and DBI, output timings of the address training data ADT_DATA<0:8> are changed according to positions of the output pads DQ0 to DQ7 and DBI.

In the exemplary embodiment, the RC delay times for the address training data ADT_DATA<0:8> are corrected by the matching unit 133a and the correction unit 133b, and the corrected address training data ADT_DATA<0:8> are transferred to the output drivers DRV0 to DRV8. Accordingly, the address training data ADT_DATA<0:8> are simultaneously outputted to the respective output pads DQ0 to DQ7 and DBI by allowing the output timings of the output pads DQ0 to DQ7 and DBI to be substantially equal to one another.

First, the control signal ADT_EN generated in the address training driver 110 is transferred from the eighth delay line RCD7 to the first delay line RCD0 through the first signal line 135a. Then, the control signal ADT_EN may be inputted from the eighth delay line RCD7 to the first delay line RCD0 as the feedback control signal ADT_EN_D through the second signal line 135b.

The control signal ADT_EN and the feedback control signal ADT_EN_D are inputted to the matching unit 133a of each of the delay lines RCD0 to RCD8. Then, the first delay units 133a_0 to 133a_n of the matching unit 133a generates the matching signals Match<0:n> based on a feedback delay time tFD that is a delay difference between the control signal ADT_EN and the feedback control signal ADT_EN_D. The matching signals Match<0:n> generated in the matching unit 133a may be inputted to the correction unit 133b to control the second delay units 133b_0 to 133b_n.

In more detail, the feedback delay time tFD is the delay difference between the control signal ADT_EN which has been transferred from the eighth output pad DQ7 to the first output pad DQ0, and the feedback control signal ADT_EN_D which is the control signal ADT_EN transferred from the first output pad DQ0 to the eighth output pad DQ7 again, and is twice as large as that of the delay value from the eighth output pad DQ7 to the first output pad DQ0. Accordingly, a half-feedback delay time tFD/2, which is a half of the feedback delay time tFD, should be applied as a delay value to be used in delay correction. To this end, the delay value of the second delay units 133b_0 to 133b_n of the correction unit 133b is set to a half of the delay value of the first delay units 133a_0 to 133a_n of the matching unit 133a.

The matching signals Match<0:n> generated in the matching unit 133a may activate the second delay units 133b_0 to 133b_n of the correction unit 133b to output the address training data ADT_DATA<0:8> to the output drivers DRV0 to DRV8. For example, when the read command RD is inputted, the ninth address training data ADT_DATA<8> generated in the address training driver 110 is outputted as a final output signal OUTPUT by the second delay units 133b_0 to 133b_n of the correction unit 133b, which are selectively activated in response to the matching signals Match<0:n>. Furthermore, the eighth output driver DRV7 corresponding to the eighth output pad DQ7 drives the final output signal OUTPUT and is outputted.

Hereinafter, the operation in accordance with the embodiment of the present invention will be described with reference to the timing diagrams.

Figure 5:
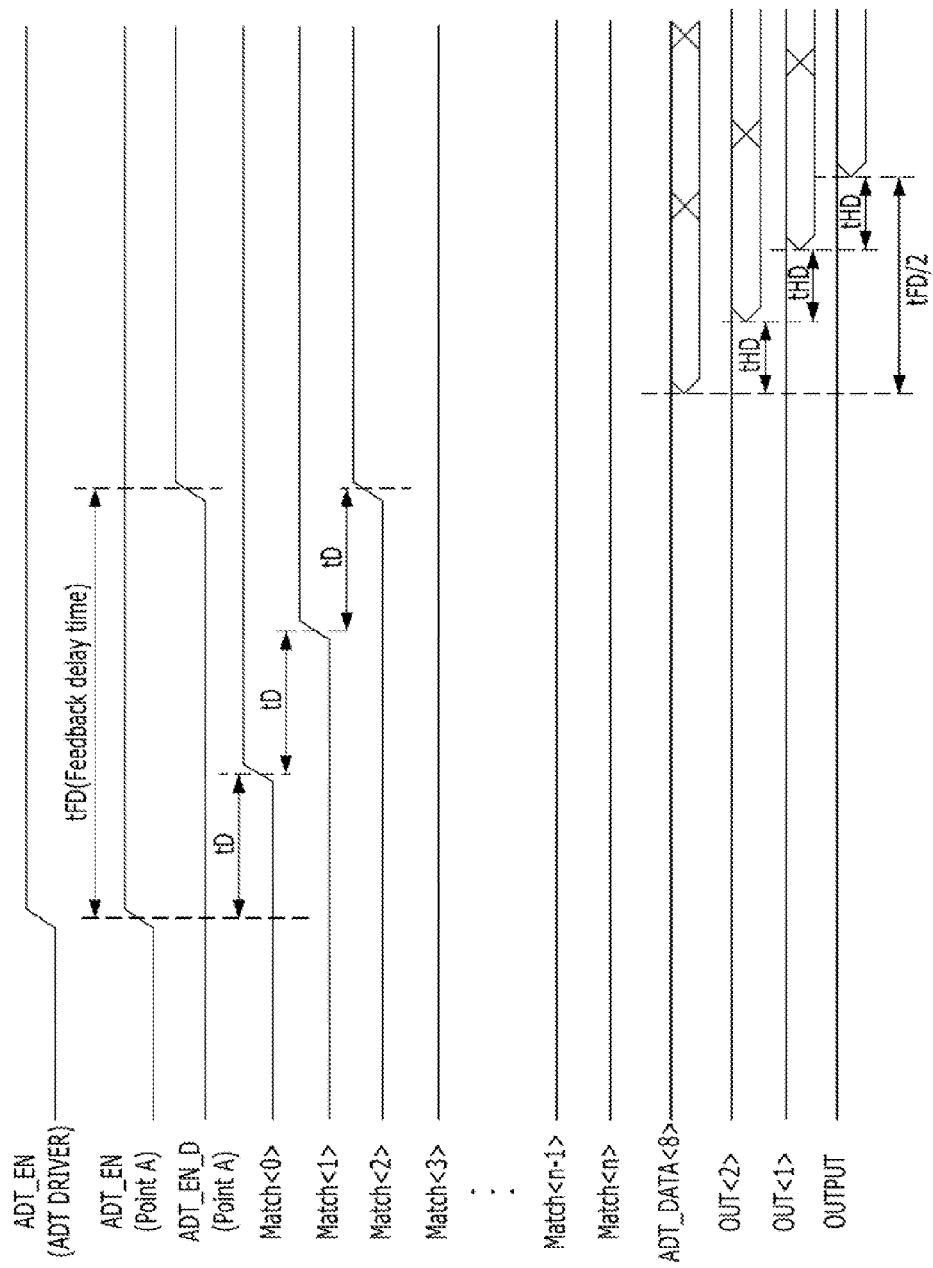
Figure 6:
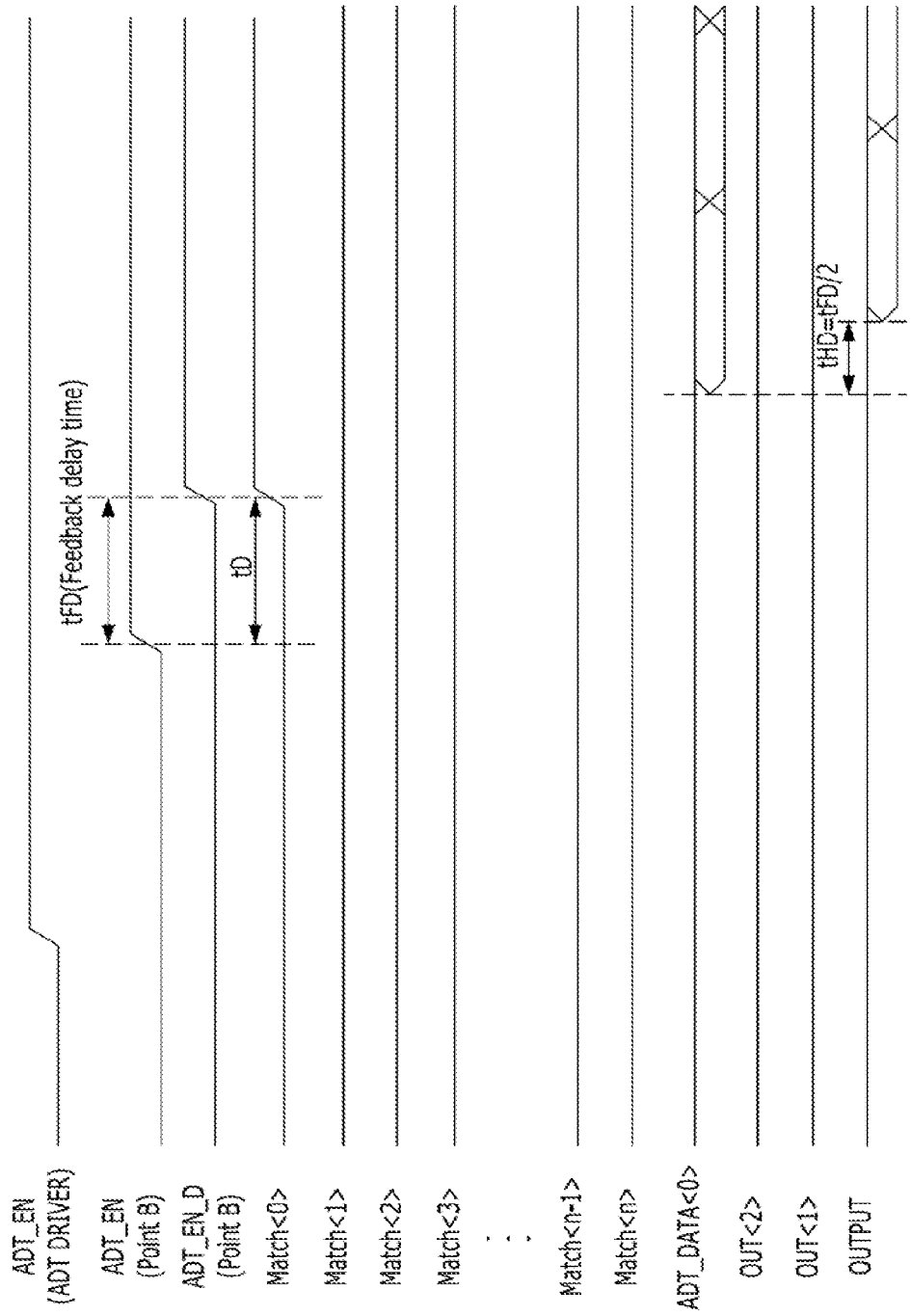

FIGS. 5 and 6 are timing diagrams explaining an operation of the semiconductor device according to positions of points A and B illustrated in FIG. 4.

FIG. 5 illustrates a timing diagram in which the control signal ADT_EN and the feedback control signal ADT_EN_D passing through the point A are inputted to the self-correction circuit 130.

The address training driver 110 is activated in response to an enable signal EN, and outputs the control signal ADT_EN to the first signal line 135a. The control signal ADT_EN is transferred to the eighth delay line RCD7 through the point A of the first signal line 135a (i.e., the first node N11 of the first signal line 135a of FIG. 1), and the feedback control signal ADT_EN_D is transferred to the eighth delay line RCD7 through the point A of the second signal line 135b (i.e., the second node N29 of the second signal line 135b of FIG. 1). The control signal ADT_EN and the feedback control signal ADT_EN_D passing through the point A are inputted to the matching unit 133a of the eighth delay line RCD7. The first delay units 133a_0 to 133a_n selectively activate the matching signals Match<0:n> by comparing the control signal ADT_EN with the feedback control signal ADT_EN_D. At this time, the first delay units 133a_0 to 133a_n may sequentially activate the matching signals Match<0>, Match<1>, and Match<2> based on the feedback delay time tFD between the control signal ADT_EN and the feedback control signal ADT_EN_D.

The matching signals Match<0>, Match<1>, and Match<2> are inputted to the correction unit 133b to activate the second delay units 133b_0, 133b_1, and 133b_2. An activation order of the second delay units 133b_0 to 133b_n of the correction unit 133b is opposite to an activation order of the first delay units 133a_0 to 133a_n of the matching unit 133a. The address training data ADT_DATA<8> is sequentially delayed by the activated second delay units 133b_0, 133b_1, and 133b_2, and output signals OUT<2> and OUT<1>, and the final output signal OUTPUT are transferred to the eighth output driver DRV7.

FIG. 6 illustrates a timing diagram in which the control signal ADT_EN and the feedback control signal ADT_EN_D passing through the point B are inputted to the self-correction circuit 130 in substantially the same method as that described in FIG. 5. In FIG. 6, the first delay units 133a_0 to 133a_n of the matching unit 133a may activate one matching signal Match<0> based on the feedback delay time tFD corresponding to a unit delay time tD. The second delay unit 133b_0 of the correction unit 133b is activated in response to the matching signal Match<0>. The address training data ADT_DATA<0> is delayed by the half-feedback delay time tHD(=tFD/2) by the activated second delay units 133b_0, and the final output signal OUTPUT is transferred to the first output driver DRV0.

Figure 7:
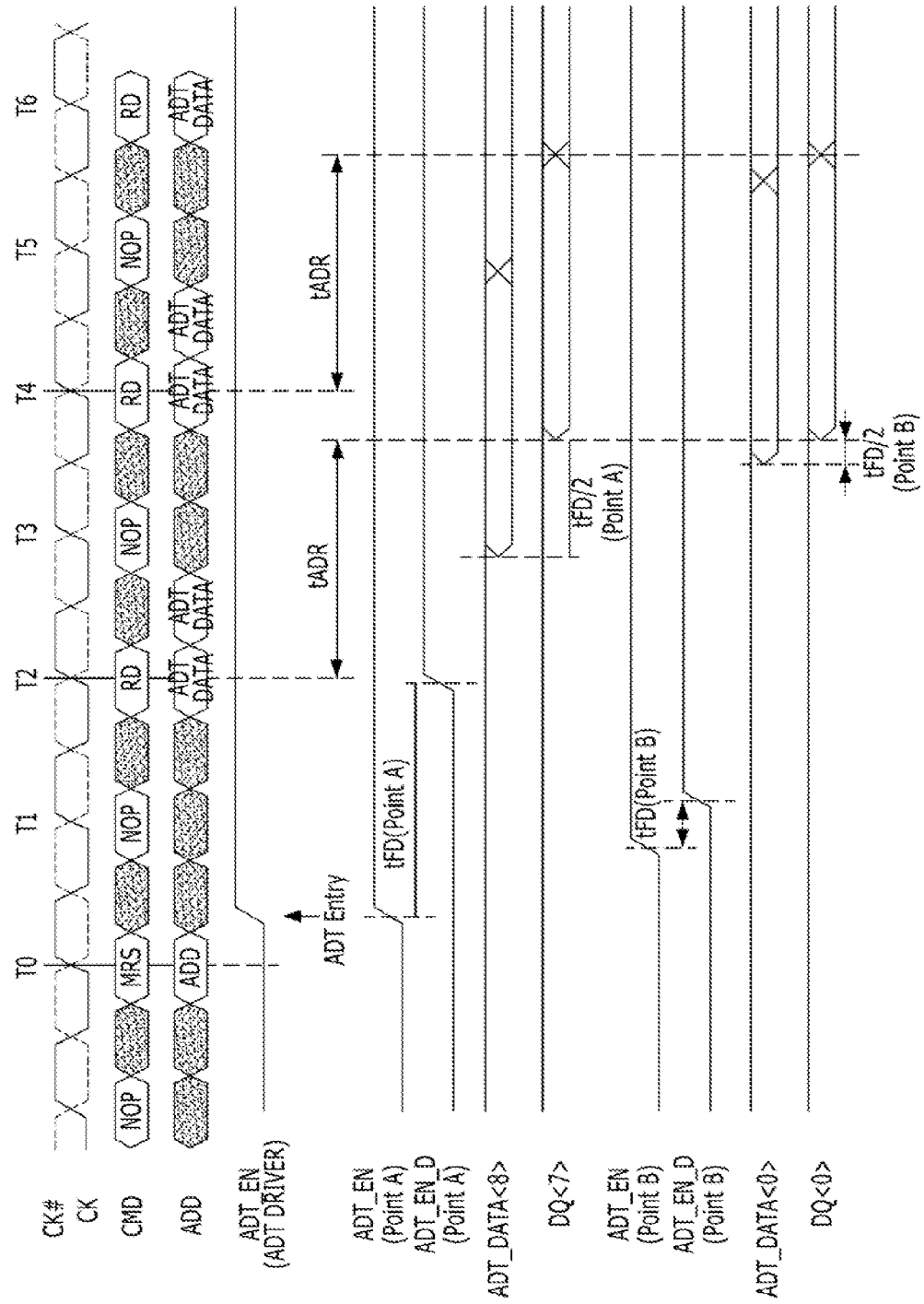

FIG. 7 is a timing diagram explaining an operation of the semiconductor device at the point A of FIG. 5 and the point B of FIG. 6 in accordance with the embodiment of the present invention.

After the address ADD and the external command MRS are inputted, the address training driver 110 is activated in response to an enable signal EN to output the control signal ADT_EN. The control signal ADT_EN may be transferred to the point A and the point B by passing through the first signal line 135a, and may be transferred to the point A and the point B as the feedback control signal ADT_EN_D through the second signal line 135b. At this time, a difference of input timings between the control signal ADT_EN and the feedback control signal ADT_EN_D at each of the point A and the point B corresponds to the feedback delay time tFD, and are twice as long as an actual RC delay time at each of the point A and the point B.

The control signal ADT_EN and the feedback control signal ADT_EN_D are inputted to the eighth delay line RCD7 and the first delay line RCD0 corresponds to the point A and the point B, respectively. The first delay units 133a_0 to 133a_n of the matching unit 133a selectively activate the matching signals Match<0:n> by comparing the inputted control signal ADT_EN with the feedback control signal ADT_EN_D, and the second unit delay units 133b_0 to 133b_n of the correction unit 133b are selectively activated in response to the matching signals Match<0:n>.

After the read command RD and the address ADD are simultaneously inputted at a timing T2 for the point A and at a timing T4 for the point B, the address training data ADT_DATA<0:8> is generated based on the address ADD and is inputted to the second delay units 133b_0 to 133b_n. The second delay units 133b_0 to 133b_n may delay the address training data ADT_DATA<0:8> by the half-feedback delay time tFD/2, which is an actual correction value, and may output the address training data ADT_DATA<0:8> to the first to eighth drivers DRV0 to DRV8 as the final output signal OUTPUT. After a predetermined time tADR lapses from the timing T2 and the timing T4, all data are simultaneously outputted to the data output circuit 150.

Figure 8:
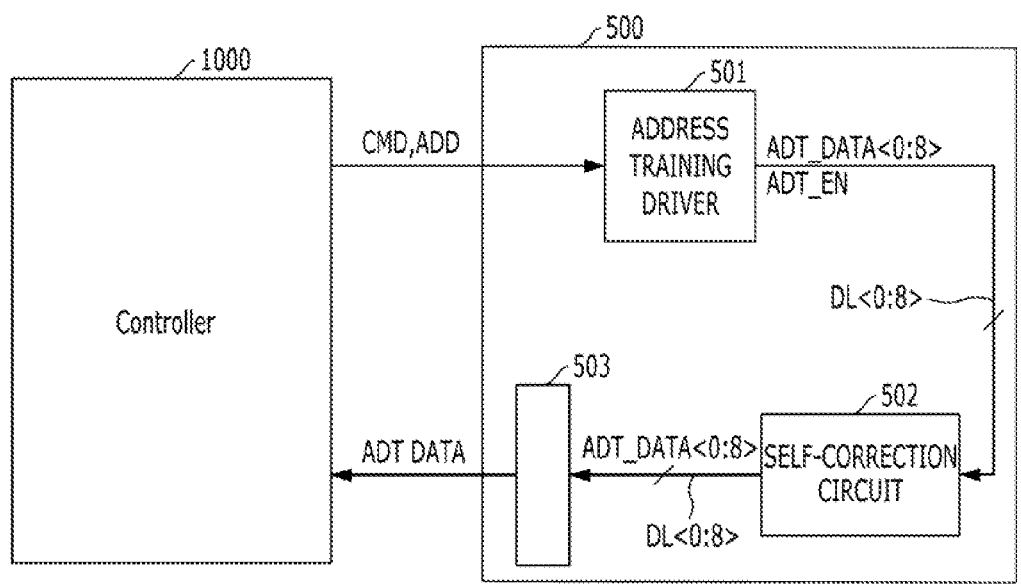
FIG. 8 is a block diagram of a semiconductor system in accordance with an exemplary embodiment of the present invention.

FIG. 8 is a block diagram of a semiconductor system in accordance with an exemplary embodiment of the present invention.

Referring to FIG. 8, the semiconductor system includes a controller 1000 and a semiconductor device 500.

The semiconductor device 500 may include an address training driver 501, a self-correction circuit 502, and a pin array 503. The semiconductor device 500 may provide the controller 1000 with address training data ADT_DATA<0:8> through the pin array 503 in response to an address ADD and a command CMD inputted from the controller 1000. The controller 1000 may check whether the transmitted address ADD coincides with the received address training data ADT_DATA<0:8>.

The address training driver 501 may generate the address training data ADT_DATA<0:8> and a control signal ADT_EN in response to the address ADD and the command CMD.

The self-correction circuit 502 may correct a delay time of the address training data ADT_DATA<0:8> that reach the pin array 503, thereby correcting skew between address training data ADT_DATA that are outputted from respective pins.

Furthermore, the self-correction circuit 502 may include the semiconductor device in accordance with the exemplary embodiment of the present invention.

Hereinafter, the self-correction circuit 502 will be described with reference to FIG. 1.

The self-correction circuit 502 may include an RC delay detection block 135 that obtains RC delay information on a plurality of data lines DL<0:8> corresponding to the pins of the pin array 503, and delay lines RCD0 to RCD7 that correct the delay time of the address training data ADT_DATA<0:8> in response to an output of the RC delay detection block 135. The RC delay detection block 135 may include a first signal line 135a, which receives the control signal ADT_EN and outputs a delay value proportional to RC delay of the plurality of data lines DL<0:8>, and a second signal line 135b, which extends from the first signal line 135a to output a delay value inversely proportional to the RC delay of the plurality of data lines DL<0:8>.

The delay lines RCD0 to RCD7 may include a matching unit 133a, which checks a delay value in response to each output signal of the RC delay detection block 135, and a correction unit 133b, which corrects output timings of the address training data ADT_DATA<0:8> in response to an output of the matching unit 133a.

The matching unit 133a may include a plurality of first delay units 133a_0 to 133a_n serially coupled to each other. The plurality of first delay units 133a_0 to 133a_n receive the control signal ADT_EN of the first signal line 135a or an output of the previous delay unit as a first input signal to sequentially delay the first input signal, and receive the feedback control signal ADT_EN_D of the second signal line 135b as a second input signal to activate matching signals Match<0:n> by comparing the first input signal with the second input signal.

The correction unit 133b may include a plurality of second delay units 133b_0 to 133b_n that receive the matching signals Match<0:n> and the address training data ADT_DATA<0:8> and output corrected address training data ADT_DATA<0:8>.

The controller 1000 may check whether the transmitted address ADD coincides with the address training data ADT_DATA<0:8> outputted from the correction unit 133b.

Hereinafter, an operation in accordance with another embodiment of the present invention will be described.

When an address ADD and an external command MRS are inputted to the address training driver 501, an address training operation is performed. When the address training operation starts, the control signal ADT_EN may be generated and transferred to the RC delay detection block 135 of the self-correction circuit 502, and the address training data ADT_DATA<0:8> are transferred to the delay lines RCD0 to RCD7 of the self-correction circuit 502 through the plurality of data lines DL<0:8>.

The RC delay detection block 135 of the self-correction circuit 502 receives the control signal ADT_EN and checks an RC delay value. The control signal ADT_EN may be transferred from the address training driver 501 to the remotest output node through the first signal line 135a, and a feedback control signal ADT_EN_D may be transferred to the address training driver 501 from the remotest output node in a reverse direction (an address training driver direction (501 of FIG. 6)) through the second signal line 135b.

In more detail, the RC delay detection block 135 may use the difference between the output timings of the control signal ADT_EN and the feedback control signal ADT_EN_D in order to measure the RC delay of the data lines DL<0:8>. Since this is substantially equal to that of one embodiment of the present invention, a description thereof will be omitted.

The matching unit 133a of the delay lines RCD0 to RCD7 receives the control signal ADT_EN and the feedback control signal ADT_EN_D and checks the feedback delay time tFD that is a delay difference between the control signal ADT_EN and the feedback control signal ADT_EN_D. The plurality of first delay units 133a_0 to 133a_n of the matching unit 133a may receive the control signal ADT_EN and the feedback control signal ADT_EN_D, generate the matching signals Match<0:n>, and check the feedback delay time tFD.

The correction unit 133b of the delay lines RCD0 to RCD7 may receive the matching signals Match<0:n>, and correct the output timings of the address training data ADT_DATA<0:8>. The matching signals Match<0:n> may be inputted to the serially coupled second delay units 133b_0 to 133b_n to activate the second delay units 133b_0 to 133b_n.

Furthermore, a time delayed by the second delay units 133b_0 to 133b_n is a half-unit delay time tD/2 that is a half of the delay time of the first delay units 133a_0 to 133a_n. This is for correcting the feedback delay time tFD, which is twice as long as a time to be actually corrected, by ½, and outputting the address training data ADT_DATA<0:8> at the half-unit delay time tD/2.

The activated second delay units 133b_0 to 133b_n may output the address training data ADT_DATA<0:8> so that the output timing may be corrected.

After the read command RD is inputted, the address training data ADT_DATA<0:8> may be generated in the address training driver 501 based on the address ADD, outputted to the correction unit 133b of the delay lines RCD0 to RCD7, corrected for the half-unit delay time tD/2, and outputted to the pin array 503. Furthermore, the data outputted from the pin array 503 may be provided to the controller 1000, and the controller 1000 may check whether the transmitted address ADD coincides with the received address training data ADT_DATA<0:8>.

While the present invention has been described with respect to the specific embodiments, it will be apparent to those skilled in the art that various changes and modifications may be made without departing from the spirit and scope of the invention as defined in the following claims.

What is claimed is:

1. A semiconductor device comprising:
a plurality of data output circuits that output data;
an address training driver that generates a plurality of address training data and a control signal;
a plurality of data lines that transfer the address training data to the data output circuits; and
a self-correction circuit that corrects a delay time of the address training data reaching the data output circuits from the address training driver through the plurality of data lines, and that corrects skew of the data outputted from the data output circuits,
wherein the self-correction circuit comprises:
a Resistor-Capacitor (RC) delay detection block that obtains RC delay information on each node of the plurality of data lines corresponding to the data output circuits,
wherein the RC delay detection block comprises:
a first signal line including a plurality of output nodes, each outputting a delay value proportional to RC delay of each node of the plurality of data lines, that receives the control signal; and
a second signal line including a plurality of output nodes, each outputting a delay value inversely proportional to the RC delay of each node of the plurality of data lines, that receives a signal at a final output node of the first signal line.

2. The semiconductor device of claim 1, wherein the self-correction circuit further comprises:
a delay block that corrects the delay time of the address training data in response to an output of the RC delay detection block.

3. The semiconductor device of claim 1, wherein the delay block comprises:
a plurality of delay lines,
wherein each of the plurality of delay lines comprises:
a matching unit that checks delay values of the plurality of data lines in response to the delay values at the output nodes of the first signal line and the second signal line; and
a correction unit that corrects an output timing of the address training data in response to an output of the matching unit.

4. The semiconductor device of claim 1, wherein the data output circuit comprises:
a DBI (Data Bus Inversion) output block including DBI information.

5. The semiconductor device of claim 1, wherein the data output circuit comprises:
an output driver enabled in response to the control signal, that drives an output of the self-correction circuit; and
an output pad that transfers a signal of the output driver.

6. A semiconductor system comprising:
a semiconductor device that provides a controller with a plurality of address training data through a plurality of pins in response to an address and a command transmitted from the controller; and
the controller that checks whether the transmitted address coincides with the received address training data,
wherein the semiconductor device comprises:
an address training driver that generates the plurality of address training data and a control signal in response to the address and the command; and
a self-correction circuit that corrects a delay time of the address training data reaching the plurality of pins from the address training driver, and that corrects skew of the address training data outputted from the pins,
wherein the self-correction circuit comprises:
a Resistor-Capacitor (RC) delay detection block that obtains RC delay information on a plurality of data lines between the address training driver and the pins,
wherein the RC delay detection block comprises:
a first signal line that receives the control signal and outputs a delay value proportional to RC delay of the plurality of data lines; and
a second signal line that extends from the first signal line and outputs a delay value inversely proportional to the RC delay of the plurality of data lines.

7. The semiconductor system of claim 6, wherein the self-correction circuit further comprises:
a delay line that corrects the delay time of the address training data in response to an output of the RC delay detection block.

8. The semiconductor system of claim 6, wherein the delay line comprises:
a matching unit that checks delay values of the plurality of data lines in response to the delay values of the first signal line and the second signal line; and
a correction unit corrects an output timing of the address training data in response to an output of the matching unit.

9. The semiconductor system of claim 8, wherein the matching unit comprises:
a plurality of first delay units serially coupled to each other, that receive a signal loaded on the first signal line or an output of a previous delay unit as a first input signal to sequentially delay the first input signal, receive a signal loaded on the second signal line as a second input signal, and activate a matching signal by comparing the first input signal with the second input signal.

10. The semiconductor system of claim 9, wherein the correction unit comprises:
a plurality of second delay units serially coupled to each other, that outputs corrected address training data by delaying the address training data in response to the output of the matching unit.

11. The semiconductor system of claim 10, wherein the second delay units have a delay value half of the first delay units.

12. A semiconductor device comprising:
a plurality of data output circuits that output data;
an address training driver that generates a plurality of address training data and a control signal, and outputs the address training data to the data output circuits through a plurality of data lines;
a first signal line including a plurality of output nodes, each outputting a delay value proportional to a delay of each node of the plurality of data lines, that receives the control signal;
a second signal line including a plurality of output nodes, each outputting a delay value inversely proportional to the delay of each node of the plurality of data lines, that receives a feedback control signal at a final output node of the first signal line; and
a delay block that corrects a delay time of the address training data reaching the data output circuits from the address training driver in response to the delay values at the output nodes of the first signal line and the second signal line.

13. The semiconductor device of claim 12, wherein the delay block comprises:

a matching unit that outputs matching signals in response to the control signal loaded on the first signal line and the feedback control signal loaded on the second signal line; and a correction unit that corrects output timings of the address training data in response to the matching signals.

14. The semiconductor device of claim 13, wherein the matching unit comprises:

a plurality of first delay units serially coupled to one another, that receive the control signal loaded on the first signal line or an output of a previous delay unit as a first input signal to delay the first input signal, receive the feedback control signal loaded on the second signal line as a second input signal, and activate the matching signals by comparing the first input signal with the second input signal.

15. The semiconductor device of claim 14, wherein the correction unit comprises:

a plurality of second delay units serially coupled to each other, that output corrected address training data by delaying the address training data in response to the matching signals.

16. The semiconductor device of claim 15, wherein the second delay units have a delay value half of the first delay units.

* * * * *